(12) United States Patent
Okada

(10) Patent No.: US 8,907,668 B2
(45) Date of Patent: Dec. 9, 2014

(54) HIGH-RESOLUTION SCANNING PRISM MAGNETOMETRY

(75) Inventor: Yoshio Okada, Boston, MA (US)

(73) Assignee: Moment Technologies, LLC, Boston, MA (US)

( * ) Notice: Subject to any disclaimer, the term of this patent is extended or adjusted under 35 U.S.C. 154(b) by 566 days.

(21) Appl. No.: 13/273,788

(22) Filed: Oct. 14, 2011

(65) Prior Publication Data

US 2013/0093420 A1 Apr. 18, 2013

(51) Int. Cl.
*G01R 33/02* (2006.01)
*G01R 33/12* (2006.01)
*G01R 33/035* (2006.01)

(52) U.S. Cl.
CPC .......... *G01R 33/1269* (2013.01); *G01R 33/035* (2013.01)
USPC ....................................................... 324/248

(58) Field of Classification Search
USPC .................. 324/244–262, 263, 282; 600/409; 505/163
See application file for complete search history.

(56) References Cited

U.S. PATENT DOCUMENTS

| | | | |
|---|---|---|---|
| 5,437,276 A * | 8/1995 | Takada | 600/409 |
| 5,885,212 A * | 3/1999 | Scharlack | 600/322 |
| 5,938,598 A | 8/1999 | Takeda et al. | |
| 6,226,538 B1 | 5/2001 | Kugai et al. | |
| 6,815,949 B2 | 11/2004 | Kandori et al. | |
| 7,002,341 B2 * | 2/2006 | Baudenbacher et al. | 324/248 |
| 7,197,352 B2 | 3/2007 | Gott et al. | |
| 7,262,597 B2 | 8/2007 | Woods et al. | |
| 7,403,809 B2 | 7/2008 | Tsukada et al. | |
| 7,672,707 B2 | 3/2010 | Takeda | |
| 2007/0167723 A1* | 7/2007 | Park et al. | 600/409 |
| 2008/0170966 A1* | 7/2008 | Cook et al. | 422/101 |
| 2009/0012384 A1* | 1/2009 | Adachi et al. | 600/409 |
| 2010/0094117 A1* | 4/2010 | Kruemmel | 600/409 |
| 2011/0217730 A1* | 9/2011 | Gazit et al. | 435/34 |

* cited by examiner

*Primary Examiner* — Patrick Assouad
*Assistant Examiner* — Demetrius Pretlow
(74) *Attorney, Agent, or Firm* — The Maxham Firm

(57) ABSTRACT

Apparatus and methods which employ a primary source mirror to scan a conductive sample containing an electric current to determine the distribution of currents in the sample, providing location, total magnitude, and direction in three dimensions of each component of the electric current distribution, by means of measuring the magnetic field external to the sample.

21 Claims, 6 Drawing Sheets

HIGH-RESOLUTION SCANNING PRISM MAGNETOMETRY

FIELD OF INVENTION

The present application relates generally to the field of measuring the magnetic fields produced by naturally occurring electric currents which flow in samples of biologic and non-biologic materials, and more particularly to the apparatus and methods for making such measurements, and the measurement of the location, magnitude, and direction of those electric currents by means of the magnetic field measurements.

BACKGROUND OF THE INVENTION

The term magnetometry refers to the detection and measurement of magnetic fields produced by biological and non-biological samples. The term biomagnetometry refers to a subclass of magnetometry that applies to the detection and measurement of magnetic field produced by biologic organisms and samples of tissue taken from such organisms. One specialty within the general field of biomagnetometry is magnetoencephalography (often abbreviated by the acronym "MEG"). MEG refers to the detection and measurement of the magnetic fields which are produced by the electric currents which flow naturally within the brain of humans and animals. Charged ionic flows within the neurons which make up part of the human brain are, in effect, an electric current which produces a magnetic field which can be measured using the methods of MEG. The electric currents which drive the pumping of the heart in an animal produce magnetic fields which can be measured using magnetocardiography (often abbreviated by the acronym "MCG"), another specialty within biomagnetometry. Measurements of the magnetic fields produced by these electric currents can be used to deduce information about the size and direction of the currents as a function of time as well as their location and distribution within the body of a person, and therefore to provide information about the state of health and the state of function of the person.

Apparatus and methods of MEG and MCG have been developed and expanded over the past forty years, enhancing sensitivity to enable the detection of magnetic fields produced by electric currents flowing deep within the body. The "field of view" of the biomagnetometers has been systematically expanded from single channel detectors of the magnetic field at one location to large helmet-shaped systems measuring the values of the magnetic fields at up to 275 locations around the head of a human being or up to 150 locations over the chest of a human being.

Biomagnetometry has also been used to measure magnetic fields produced by electric currents flowing in biologic samples such as brain tissue slices of laboratory animals. In these systems, methods have been developed to bring the detector of the magnetic field as close as possible to the electric current itself to maximize the size of the measured signal and the ratio of the signal to the background magnetic noise. In some case, spacing as small as 1 mm or less have been achieved. This close spacing also enables enhanced spatial resolution—the ability to more precisely determine the spatial distribution of the electrical currents in the biologic sample which are producing the measured magnetic field.

Generally, the biomagnetic measurements of biogenic electric currents are useful for measuring the distribution of such currents in a tissue such as a brain slice or in an organ such as a brain or heart. However, the magnetometry using the same techniques as in biomagnetometry can be applied to measuring the electric currents flowing in non-biological objects. For example, non-destructive testing of electronic circuits can be performed by determining the electric current flow patterns in those circuits during their operation by measuring the magnetic fields produced by those currents. Because magnetometry can have very high levels of frequency response, subtle and otherwise undetectable malfunctions during high frequency operation may be identified in this manner. In non-destructive evaluation of materials such as a portion of the jet wing, for example, the magnetometry can be used to detect the presence of cracks by measuring the magnetic field associated with induced electric currents in the material.

The use of magnetic measurement techniques to provide information on the spatial distribution of electrical currents with very high precision can currently be implemented in scanning devices such as scanning magnetic microscopes. Such scanners use methods for moving either the sample being scanned or the magnetic measurement device in a very precise and well calibrated manner to collect the spatial distribution information.

However, a major limitation in the application of the biomagnetic techniques for the purposes outlined above arises from a fundamental property of magnetic fields produced by electric currents flowing in tissues or organs. Any electrogenic biological tissue or organ can be described as a circuit of electrically active cells that produce the biogenic current. In intact humans or animals the tissue of the organ that contains such electrogenic cells is saturated with physiological saline. In in vitro preparations, such a tissue is immersed in a bath of physiological saline. The physiological saline conducts electricity; thus, the medium containing the saline such as the brain or the head, or a bath containing the tissue, is called a "conductive medium." (The term "conductive" used here and throughout this disclosure, including the specification, drawings, claims, and abstract, refers to the property of electrical conductivity and should be interpreted as such unless otherwise stated.) A homogeneous conductive medium is a conductive medium in which the electrical conductivity is uniform throughout the conductor as is the case for a saline bath containing a biological tissue. A non-homogeneous or heterogeneous conductive medium is a medium in which the electrical conductivity is non-uniform. The brain and heart are, strictly speaking, non-homogeneous media, but they can each be very well approximated as a homogeneous medium.

From the fundamental principles governing electromagnetism in homogeneous conductive media, an electric current which flows within and proximate to the surface of such a conductive medium and flows in a direction which is perpendicular to the surface of that medium produces no net magnetic field external to the medium itself. This is strictly true when the conducting medium is spherical or flat. A large bath can be thought of as a part of an infinitely large sphere. But it is very well approximated even in a conducting medium that lacks a spherical symmetry when the cells are close to the boundary separating the conducting medium from the surrounding non-conducting medium. This factor has limited the utility of biomagnetic measurements such as MEG in providing complete information about electric currents in a tissue or in an organ. Conventional biomagnetic techniques can provide the information only about those components of the electric currents flowing within homogeneous conducting media which flow in a direction parallel to the surface of that medium, but not the currents which flow normal to the surface. In other words, conventional biomagnetometry provides the information about one component of the biogenic current but not the other, thus providing incomplete information regarding the total current produced by biological generators of electric currents. In general, this factor has significantly constrained the application of the biomagnetic techniques for measuring biogenic currents from various organs including the brain and heart in humans and animals.

Similar limitations apply for measurements of some non-biological samples which present current flows in a homogeneous conductive medium. The same limitations also apply to scanning magnetometers constructed to provide high spatial resolution measurements of the distribution of electrical currents in biological and non-biological materials and samples. If this limitation is removed, the utility of such scanning magnetometers would be expanded.

Apparatus and methods for removing this limitation in the field of biomagnetic measurement has been recently developed and has been disclosed in U.S. patent application Ser. No. 13/040,027, filed 3 Mar. 2011. This apparatus requires the placement of a non-conducting object known as a primary source mirror (hereinafter PRISM), within a conducting medium in close proximity to the electric currents of interest. Apparatus and methods for expanding the basic method of a single primary source mirror by employing large numbers of such mirrors concurrently and by packaging arrays of PRISMs into modules has been disclosed in U.S. patent application Ser. No. 13/206,392, filed 9 Aug. 2011. The methods disclosed in these applications can be configured and applied in a novel manner to create a scanning magnetometer which does not suffer from the limitations described above concerning the incomplete measurements of biogenic and non-biogenic currents.

The subject matter disclosed in the Ser. No. 13/040,027 application enables a complete characterization of the generator of electric current by introducing a device called a PRISM that effectively transforms a homogeneous conductive medium into a non-homogeneous conductive medium. In both biological and non-biological conductive media, there are some cases in which the conductivity in the medium varies sufficiently so that the biogenic current perpendicular to the overlying conductivity boundary (such as the scalp-air, chest-air boundary, or saline-air boundary) can, in principle, produce a non-zero magnetic field outside the conductive medium. However, in all such cases the precise geometry and nature of the heterogeneous property of the medium is not known since it is determined physiologically or physically. Therefore it is not possible to use this feature of naturally occurring non-homogeneity to accurately measure the otherwise nondetectable perpendicular current generators. The PRISM device of the '027 application provides a means to selectively measure the magnetic field from the electric current generator of the magnetic field in a target region of the sample without interference from the current generators in other regions of the sample. The PRISM invention furthermore provides a means to increase the spatial resolution of the target volume by at least one order of magnitude compared to conventional magnetometry techniques since the spatial resolution is determined by the distance between the PRISM and the sample, not by the distance between the sample and magnetic field detector and by the size of the magnetic field detector as is the case in conventional magnetometry. This PRISM invention, however, does not provide a means to determine the distribution of currents in the entire sample. The PRISM array in the '392 application provides a means to determine the current distribution over the entire sample, but the spatial resolution is determined by the size and spacing of the PRISMs in the array, which will be relatively coarse in practical applications.

The scanning magnetometry invention embodiments described here extend the utility of the above two inventions by enabling the determination of the spatial distribution of currents in a sample with high-resolution without being limited by the size and spacing of PRISMs in an array or by the size of the magnetic field sensors. This invention then significantly expands the capability of scanning magnetometers to measure the location, magnitude, and direction of electric currents flowing in a conductive medium.

SUMMARY OF EMBODIMENTS OF THE INVENTION

Accordingly, it is a purpose of embodiments of the present invention to provide apparatus and methods for a novel method of scanning magnetometry which enables an expanded ability to determine the spatial distribution of currents in a biological or non-biological sample with high spatial resolution. The use of these embodiments will enable a more complete assessment of all components of electric currents which flow within such objects.

The following summary of embodiments of the invention is provided to enable an understanding of some of its novel features but is not intended to be a full description. A full appreciation of the aspects of the various embodiments will be provided by the specification, claims, drawings, and abstract as a whole.

One feature of the invention is to provide a scanning magnetometer which includes a PRISM in which a secondary source is induced by a primary electric current flowing perpendicular to a surface of a conductive medium wherein the position of the PRISM is scanned over the surface enabling high spatial resolution measurement of all electric currents flowing near the surface.

A further feature of the invention is to provide an apparatus and method which enables one or more PRISMs as a linear array of PRISMs to be moved across the surface of a sample, enabling the recording of the magnetic fields produced by secondary sources induced by primary electric currents flowing at any location near the entire surface of the sample.

A further feature of the invention is to provide a two-dimensional array of PRISMs which can be passed in two dimensions over a sample, enabling a more rapid means for recording the magnetic fields produced by secondary sources across a conductive medium sample.

A further feature of the invention is to provide movement of PRISMs over incremental distances which produce higher spatial resolution than would otherwise be limited by spacing between the PRISMs.

A further feature of the invention is to provide an apparatus and method which enables an expanded capability to detect and measure electric currents flowing both horizontally and vertically in specimens of neurological tissue from humans and animals in vitro.

A further feature of the invention is to provide an apparatus and method which enables an expanded capability to perform functional assessments of non-biological conductive devices, such as printed electronic circuit boards containing electric currents.

BRIEF DESCRIPTION OF THE DRAWING

The objects, advantages, features, and other desirable characteristics of embodiments of the invention can be readily perceived from the following detailed description and attached drawings, in which.

DETAILED DESCRIPTION OF EMBODIMENTS OF THE INVENTION

As described above, it is a fundamental property of the physics of electromagnetism that, at the boundary between a conductive medium and a non-conductive medium, an electric current which is flowing within the conductive medium and in a direction parallel to the boundary produces a magnetic field that extends throughout both the conductive and non-conductive media. However, an electric current which is flowing within the conductive medium and in a direction orthogonal to the boundary produces a magnetic field which extends throughout the conductive medium but produces no magnetic field in the non-conductive medium. (see F. Grynszpan and D. B. Geselowitz, Biophysics Journal, Vol 13, pp. 911-925 (1973); also D. Cohen and H. Hosaka, *J. Electrocardiol.*, 1976, Vol. 9, pp. 409-417 (1976); also Y. C. Okada and C. Nicholson, *Biophys. J.*, Vol. 53, pp. 723-731 (1988)). This is strictly true for a homogeneous conducting medium having a spherical symmetry such as a sphere or a semi-infinitely large saline bath. A human head can be approximated as a sphere. A large bath containing a tissue immersed in a physiological saline can be approximated as a semi-infinitely large bath. In this case, the approximation is excellent. The conductivity profiles of biological organs such as a brain or a heart are, strictly speaking, not homogeneous, but they can be well approximated as homogeneous conductors in practice.

One effective means for determining the characteristics of an electric current flowing in a conductive medium, including its location, amplitude, and direction of flow as a function of time, is by measuring the magnetic field produced by that current. Scanning magnetometers have been constructed which externally scan the surface of a conductive medium containing one or more electric currents. However, because magnetic fields external to the conductive medium are only produced by those currents which flow in a direction parallel to the surface or boundary of the medium, these scanning magnetometer systems are limited to determining the characteristics only for the electric current components which are parallel to the surface of the medium.

Figures 1, 2:
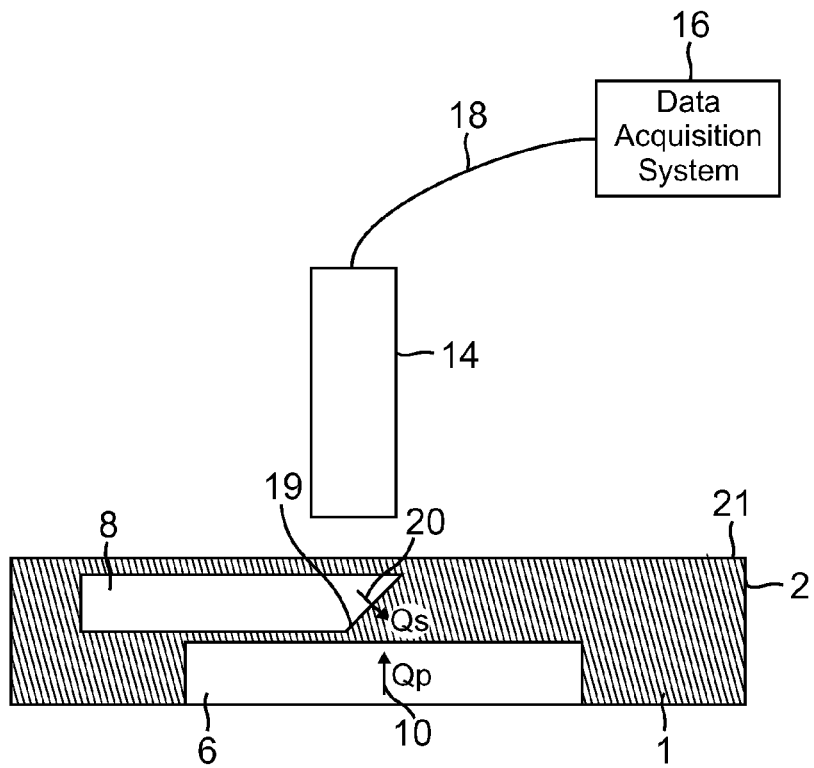
FIG. 1 is a schematic view of an apparatus which enables the detection and measurement of the magnetic field produced by electric currents flowing in a biologic sample located in a conductive material (for example, a liquid or a gel) in accordance with the prior art.
FIG. 2 is an enlarged schematic view of the prior art non-conductive structure or PRISM of FIG. 1 in which a secondary source is induced by a primary electric current.

All embodiments of the present invention are aimed at removing this limitation and incorporating the resulting improved measurement method into an apparatus which scans over a conductive medium containing electric current flows of any orientation relative to the surface of the medium. Moreover, these embodiments provide means to determine the spatial distribution of the current flows over the sample with ultra-high spatial resolution, at least one order of magnitude greater than the currently available methods. FIG. 1 shows a stationary version of a magnetic detection system which makes use of a primary source mirror or PRISM to alleviate the limitation of earlier detection systems described above. This basic system is disclosed in the US '027 patent application filed on 3 Mar. 2011.

In FIG. 1, a biologic sample 6 is shown immersed in conductive solution 1 contained within vessel 2. Small electric current elements generated by electrogenically active cells can be represented as "primary current dipoles," each of which is characterized by a current amplitude and direction of flow and a length between a source and a sink between which the current flows. The vector sum of such primary current dipoles in a volume of tissue can be represented by an equivalent single primary current dipole. In the biologic sample in FIG. 1, an equivalent primary current dipole in a population of vertically oriented neurons is represented by arrow 10. Any current dipole within the sample can be expressed by basic vector mathematics as the sum of two components; one component oriented along the direction perpendicular to the surface of the sample, and one component oriented in a direction parallel to the surface of the sample. In FIG. 1, current dipole 10 is oriented perpendicularly to the surface of biologic sample 6. Placed above the top surface of the biologic sample and within conductive medium 1 is non-conductive solid 8 having flat face 19 at one end at an angle of approximately 45 degrees from being parallel with the upper surface of the sample. The 45-degree face is positioned approximately above primary current dipole 10. According to the theory of secondary sources in conductive and non-conductive media, a secondary source of magnetic field 20, as shown in FIG. 2, is induced on surface 19 of the non-conductive solid by primary current dipole 10 (see, for example, R. Plonsey in *Biomagnetism*, Berlin, De Gruyter, pp. 177-205 (1981)). This secondary dipolar source is positioned on the boundary surface of the non-conductive solid oriented perpendicular to face 19 of the non-conductive solid. Surface 19 is referred to as a primary source mirror or PRISM.

FIG. 2 shows a fragment of non-conductive solid 8 and secondary source 20 induced by primary current 10. Secondary source 20 can be resolved into two components by simple vector physics, one component, represented by arrow 22, being parallel and the other component, represented by arrow 24, being perpendicular to surface 21 of conducting medium 1 in FIG. 1. Since component 22 is parallel to surface 21, it produces a net magnetic field above the conductive medium which can be detected and measured by a magnetic field sensor or magnetometer 14. The output from magnetometer 14 is transmitted to a data acquisition and analysis system 16 via cable 18. This apparatus then produces values of the magnetic field produced by secondary current dipole 20 which is induced by primary current dipole 10. These values provide information, such as location, direction, and current magnitude as a function of time, characterizing the primary current dipole source. As the primary current changes its characteristics in time, the values of the magnetic field will change as well. The frequency response available via this method utilizing secondary sources is comparable to the frequencies exhibited by the primary current. (Note that FIG. 1 shows a non-conducting solid with a single surface 19 as a PRISM. However, it is a straightforward extension of the PRISM concept to provide two or more surfaces on a single non-conducting solid, each of which can act as a PRISM.)

A typical apparatus such as that described above for use in a biomagnetic application would consist of: 1) vessel 2, which may be a Petri dish with a diameter of approximately 5 cm and depth of about 5 mm; 2) biologic sample 6 having a thickness of about 0.01 to 0.4 mm; 3) an oxygenated physiological saline solution as a conductive medium filling the Petri dish to the rim; 4) a cylindrical glass rod of diameter approximately 1 mm and length of about 2 mm as the non-conductive solid 8 with one end sealed and polished to form surface 19 (PRISM) at an angle of approximately 45 degrees from the axis of the cylindrical glass rod; and 5) wherein magnetometer 14 has a sensitivity to magnetic fields of at least 100 femtoTesla per root Hertz. However, a variety of types of magnetometers may be used to detect the magnetic field produced by one or more secondary sources, depending on the strength of the secondary source. Hall effect magnetometers, flux gate magnetometers, pumped optical or atomic magnetometers, and SQUID-based magnetometers, amongst others, are all candidates for use in this apparatus. (SQUID is a common acronym for "superconducting quantum interference device.")

Figure 3:
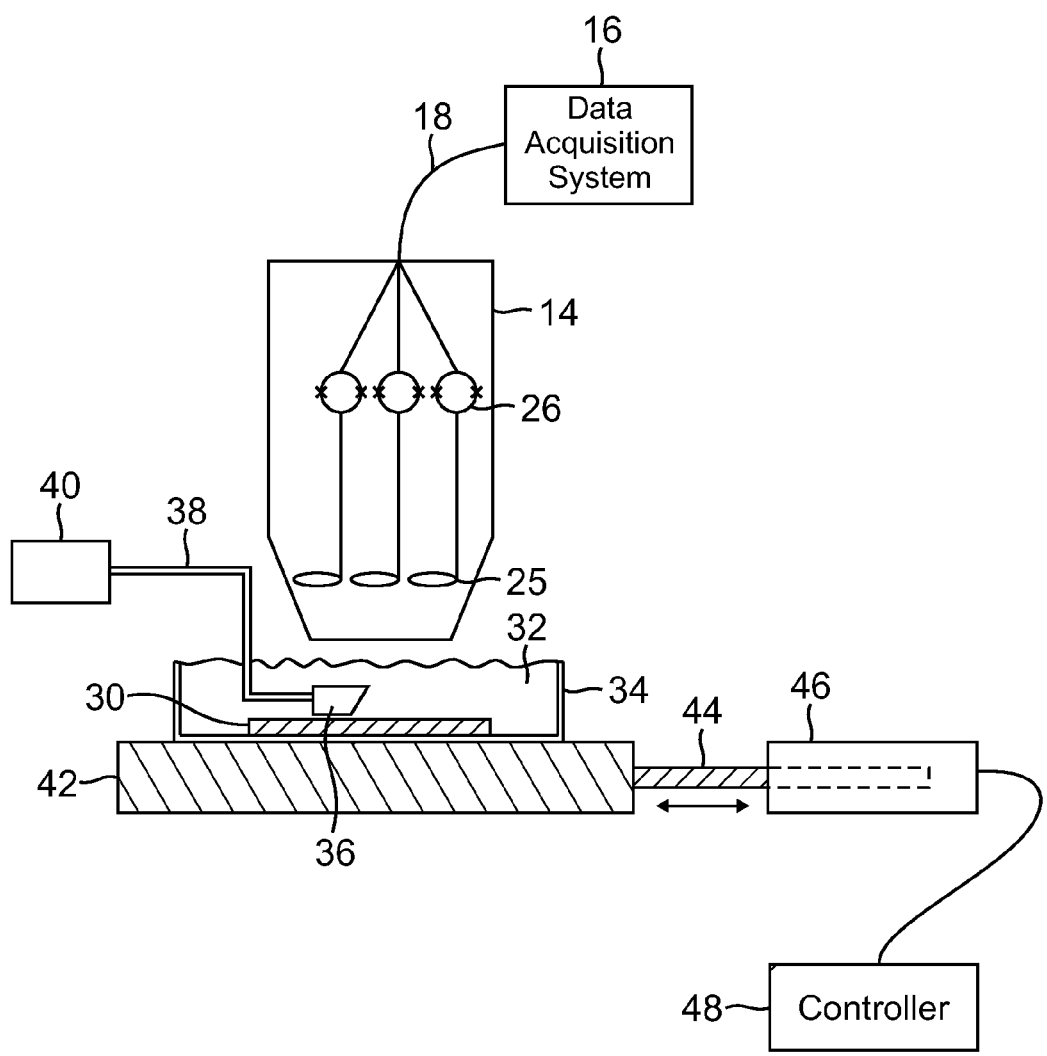
FIG. 3 is a schematic diagram of an apparatus in accordance with an embodiment of the invention in which the relative position of a PRISM and a sample containing electrical currents may be changed so that the electrical current pattern is scanned.

The foregoing apparatus and methods have been disclosed in both U.S. patent application Ser. Nos. 13/040,027 and 13/206,392. The current invention applies the previously disclosed apparatus and methods to construct a novel scanning PRISM magnetometry method, that is, a scanning magnetic field measurement system which enables the rapid and efficient measurement of the electrical currents of all orientations flowing in samples of interest with a high spatial resolution. A preferred embodiment of the invention is shown in FIG. 3. In this Figure, a biological sample containing the primary current sources of interest 30 is immersed in a conductive liquid bath 32 contained within a container 34 which is located on support plate 42. Positioned above a region of interest in sample 30 and within the conductive liquid bath is a non-conductive solid with one surface forming a primary source mirror or PRISM 36. (The term PRISM will be used herein to refer to a non-conductive solid with at least one surface which acts as a primary source mirror and should be understood as such unless otherwise specified.) The PRISM is attached to and supported by support rod 38 which is itself supported by and connected to drive mechanism 40. The drive mechanism 40 and support rod 38 are configured to enable the movement in one direction of the PRISM 36 over the upper surface of sample 30. The vertical distance between the PRISM 36 and the surface of sample 30 may be adjusted to optimize the performance (for example, to optimize the signal-to-noise ratio and spatial resolution) of the scanning system. Support plate 42 is also connected by rod 44 to drive mechanism 46 which is controlled by controller 48. Drive mechanism 46 is configured to allow the movement of the support plate independently from the PRISM and magnetometer. When this drive mechanism is activated, the sample in the conductive liquid bath is moved beneath the PRISM. The use of two drive mechanisms provides greater flexibility in the proposed scanning magnetometer by enabling the measurement of current distribution in sample 30 to be carried out by moving either PRISM 36 over sample 30 with drive mechanism 40, or by moving sample 30 and support plate 40 with drive mechanism 46.

Typical dimensions for a sample 30 range from a few millimeters to several centimeters in diameter, although there is nothing in the principles of this embodiment which limit its operation to such dimensions. Typical PRISM dimensions range from a few tenths of a millimeter to 1 or 2 mm for length, width, and height. Typical spacing between a PRISM and the surface of the sample containing the primary current source will preferably be about 0.01 to about 1 mm, depending on the desired level of signal-to-noise ratio and spatial resolution. Typical materials used for PRISMs include glass and solid polymers.

Positioned above the sample and conductive liquid bath is magnetometer 14. While any suitable sensitive magnetometer may be used for this purpose, the magnetometer in this preferred embodiment is one which utilizes an array of superconducting pickup coils 25 to detect the magnetic field produced by a primary electric current flowing in the sample and the secondary source induced in the PRISM by the primary current. The leads from the pickup coils are connected to the input of amplifiers which amplify the signals detected by the pickup coils and direct those signals via interconnecting cable 18 to data acquisition system 16. This type of magnetometer is well known. See, for example, Tsukada et al., U.S. Pat. No. 7,403,809, which discloses a magnetometer of this type. Magnetometer 14 is preferably selected to provide measurement sensitivity over the entire sample area without repositioning the sample or magnetometer, although this factor is not a requirement for operation of the device.

For each position of the PRISM over the surface of sample 30, the magnetic field pattern is measured by using magnetometer 14 and the measured values are recorded in data acquisition system 16. In this way, the magnetic field patterns are recorded for PRISM positions over the entire surface of the sample. These magnetic field patterns are then used to infer the location, magnitude, and direction of the electric currents flowing within the sample, including components flowing both parallel and perpendicular to the surface of the sample. The spatial resolution of this data is improved by using a small PRISM, by placing it closer to the sample, and by moving the PRISM in smaller increments between magnetic field recordings. The smaller the PRISM and the closer the PRISM to the sample, the better is the spatial resolution of this technique. Importantly, this spatial resolution is relatively independent of the size of magnetic field pick-up coils 25 in magnetometer 14.

This embodiment thus enables the movement of the PRISM 36 relative to the surface of sample 30 in a controlled manner. A variety of types of drive mechanisms 40 and 46 may be used for this purpose. For both mechanisms 40 and 46, it is preferred to utilize a drive mechanism which provides very precise position and position change data to enable high-resolution scanning magnetometry. Examples of suitable high spatial resolution drive mechanisms include so-called inchworm devices, piezoelectric stepper devices, and microelectromechanical devices (MEMS). One of the limiting factors in making ultra-sensitive magnetic measurements with SQUID magnetometers is the presence of relative vibration between pickup coils 25 and the sources of the magnetic fields being measured, in this case sample 30 and PRISM 36. The arrangement shown in FIG. 3 with two drive mechanisms permits rapid gross position adjustment of the support table using drive mechanism 46 and subsequent lock down of the table to minimize vibration. Both drive mechanisms 40 and 46 and support rods 38 and 40 must be constructed to minimize residual vibration in a given measurement position. In addition, it should be constructed to minimize the settling time once a position change is executed, so that the time between recordings can be minimized as well.

FIG. 3 shows a preferred embodiment with movement in one direction provided by each drive mechanism. However, it is a straightforward extension of this embodiment to construct one with drive mechanisms which enable movement of the PRISM and the support table in two directions, thus enabling coverage of the entire surface of the sample. The number of pickup coils and the size of the sensitive region of magnetometer 14 may be chosen large enough to enable detection of the PRISM over all regions of the sample concurrently. Magnetometers with over 275 independent pickup coils and SQUIDs which can be suitable for this purpose are available commercially from Elekta Ltd, a Swedish company, and from CTF MEG, a Canadian company. Thus with a drive mechanism which can move the PRISM in two dimensions, the entire surface of a sample can be scanned without movement of magnetometer 14. This feature of the embodiment is particularly significant when the magnetometer is one which utilizes superconducting devices or SQUIDs such as that shown in FIG. 3 because those magnetometers are generally very sensitive to vibration and movement and typically require an extended period to settle down once moved before they can be used with full capability. Requiring movement of such a magnetometer to scan a sample would dictate a much longer time to complete a scan than is offered by the current embodiment.

An example of a non-biologic sample for which the novel scanning magnetometer disclosed herein would be applicable is an electronic device such as a sonar generator which is intended for use while immersed in sea water, a conductive liquid. Assessment of the performance of the device, including the detection of an electric current flow which is indicative of a malfunction, often must be conducted in the environment in which the device use is intended. Sensitive detection and measurement of such a current flow can be effectively performed using a magnetometer, but the limitations discussed above in regard to a biologic sample would apply in this case as well. Use of a scanning magnetometer similar to that shown in FIG. 3 will enable an efficient scanning process over the device in question within its normal working environment without the limitation of only being able to detect current flows parallel to the surface between the device and sea water environment being used.

Figure 4:
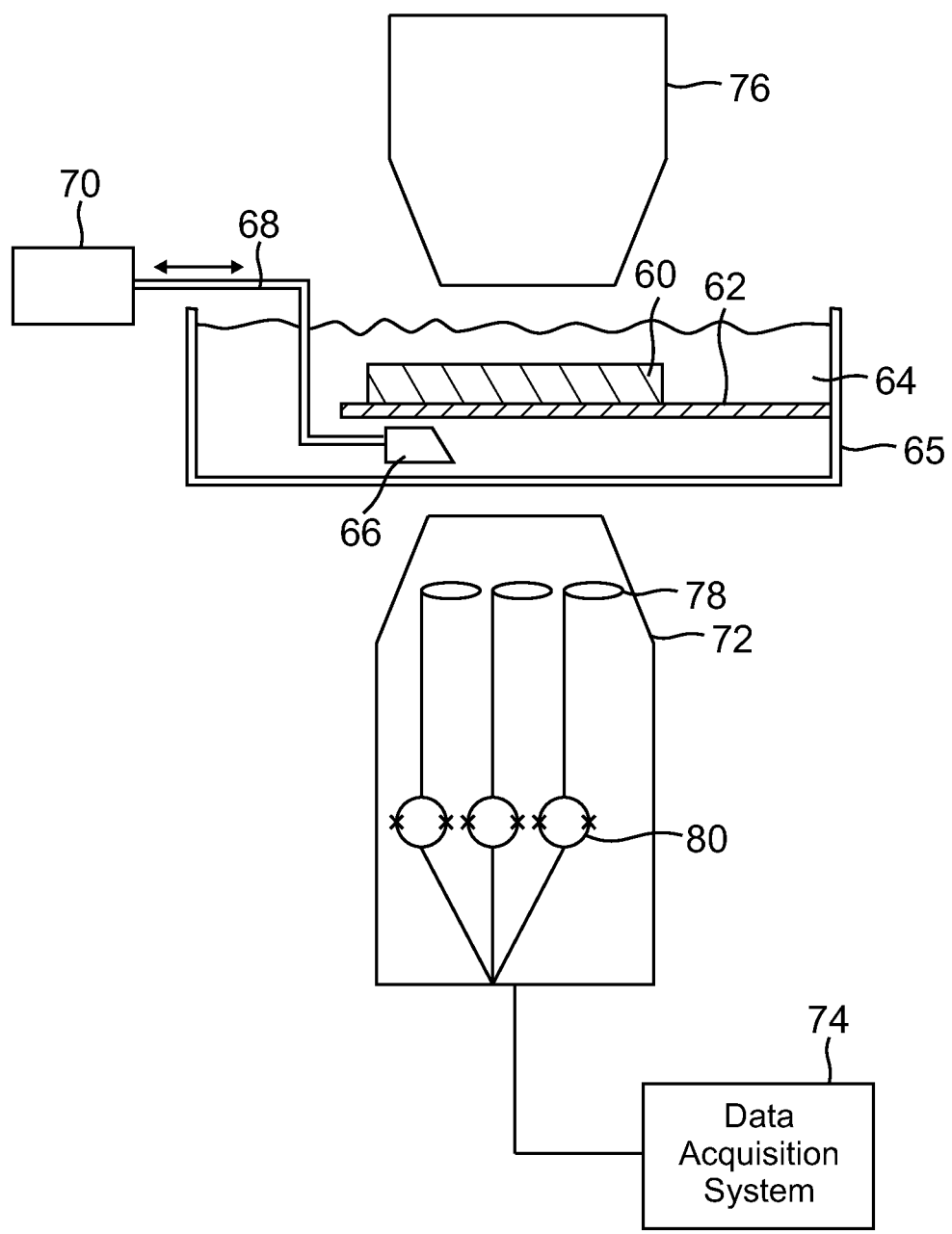
FIG. 4 is a diagram showing an alternative geometry of an embodiment of the invention wherein the PRISM is scanned over the lower surface of a sample containing electric currents.

An alternative but similar embodiment to that shown in FIG. 3 is shown in FIG. 4. In this figure, the conductive sample 60 containing a primary electric current source is located within a conductive liquid bath 64 in vessel 65, with the sample resting on conductive shelf 62. PRISM 66 is located below the shelf within the conductive liquid and is configured so that secondary sources will be induced in the PRISM by the primary current source. A superconducting magnetometer 72, similar to that shown in FIG. 3, is located below the container 65 and measures the magnetic fields produced by the primary electric current and by the secondary sources. PRISM 66 is supported by rod 68 connected to drive mechanism 70. Thus, the PRISM maybe moved over the lower surface of the sample using the drive mechanism in a similar manner as described above. This configuration permits the upper surface of the sample to be observed using an optical or X-ray or other microscope while the magnetic measurements are underway.

Figure 5A:
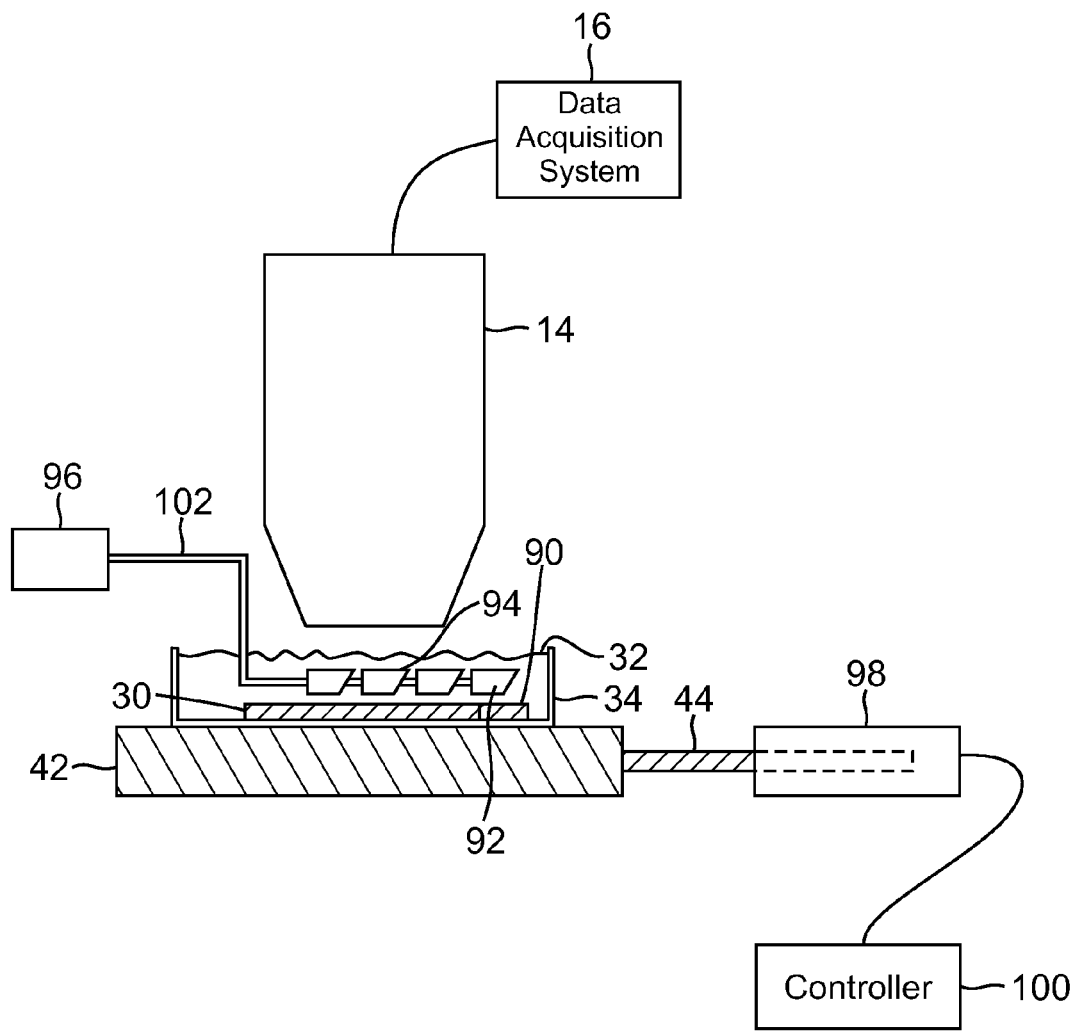
FIG. 5A is a diagram showing an embodiment of the invention in which a linear array of PRISMs is employed.
Figure 5B:
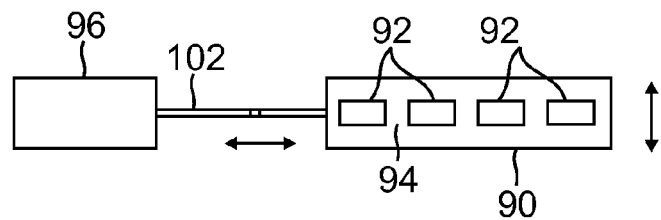
FIG. 5B is a diagram showing a top view of the detail of the linear array of FIG. 5.

FIGS. 5A and 5B show another embodiment of the invention in which the concept of the scanning magnetometer shown in FIG. 3 is extended to incorporate a linear array 94 of PRISMs. The same arrangement for the sample 30 and conductive liquid bath 32 in vessel 34 mounted on support plate 42 can be used for this embodiment. However, in this embodiment, a linear array of PRISMs is positioned over the sample. The PRISMs 92 in linear array 94 are mounted on support structure 90 which is supported by and connected to drive mechanism 96 by rod 102. Support plate 42 is connected by rod 44 to drive mechanism 98 which is controlled by controller 100 in a similar manner as for the embodiment shown in FIG. 3. Spacing between individual PRISMs is typically the same order as the dimension of the individual PRISMs. In this configuration, the electric current produced by the primary current generator in the sample is deflected by the PRISMs and the surfaces of supporting structure 90. The currents in the saline reflected at the surface of the PRISMs and the supporting sheet all produce secondary current generators of a magnetic field. However, importantly, the secondary sources on the surface of the supporting structure are all oriented perpendicular to the bath surface and thus, according to the theory of secondary sources mentioned above, these sources do not produce a magnetic field outside the bath. The only secondary sources that generate a magnetic field outside the bath are located in the PRISMs. Therefore, the supporting structure 90 is effectively transparent for determining the distribution of currents in the sample based on the magnetic field from the PRISMs. For optimal employment of this embodiment, magnetometer 14 is selected to have a sufficiently large number of magnetic detectors so that the entire area of the sample is measurable concurrently. This magnetometer 14 should provide sufficiently small spacing between detectors to provide the desired spatial resolution required for detecting the magnetic field from the individual PRISMs. Also for this embodiment, the drive mechanism is configured to move the support structure and PRISM array primarily in a direction perpendicular to the line of PRISMs and parallel to the surface of the sample. Thus, scanning of the entire surface of the sample is accomplished in a substantially reduced number of steps as would be required when using the embodiment of FIG. 3. Drive mechanism 96 is also preferably capable of moving the PRISM array in a direction parallel to the line of the array but only through distances which are small increments of the separation between elements of the array. This can provide a finer spatial resolution, not limited by the spacing between the elements of the array.

Figure 6A:
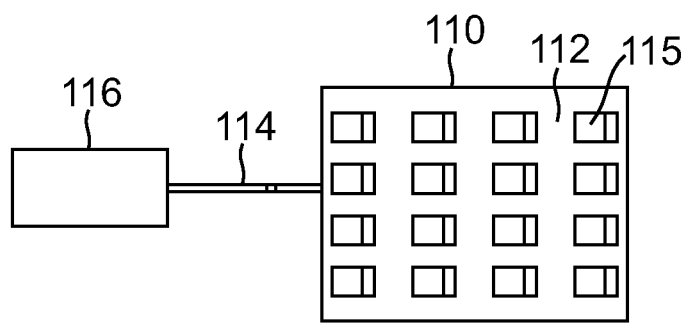
FIG. 6A is a diagram showing a top view of a two-dimensional array of PRISMs which is employed in another embodiment of the invention.
Figure 6B:
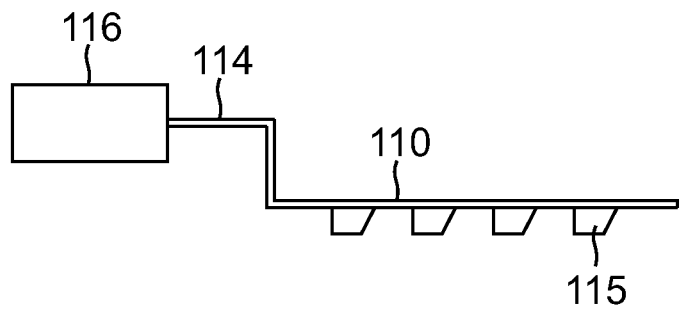
FIG. 6B is a side view of the array of FIG. 6A.

Another embodiment of the invention is shown in FIGS. 6A and 6B. This embodiment expands further upon the concepts in the embodiment shown in FIG. 5 by incorporating a two-dimensional array of PRISMs 112. Typical spacing between individual PRISMs is again on the same order as the dimensions of the individual PRISMs. The PRISMs 115 are mounted on a support sheet 110 in such a manner as to enable the surface of each PRISM to be located close to the surface of a sample. One method for constructing this is to attaching each PRISM to the underside of the support sheet using an appropriate adhesive such as epoxy or cyanoacrylate, with each PRISM oriented so that the surface upon which the secondary source is induced is optimally positioned with respect to the surface of the sample to maximize the size of such secondary source. As in the case of the linear array in FIG. 5, the secondary sources on the surface of the support sheet are vertically oriented and thus they do not produce the magnetic field outside the bath, effectively rendering the support sheet transparent for the purpose of the scanning magnetometry. This greatly simplifies the estimation of the primary currents in the sample based on the magnetic field measured above the bath surface. Support sheet 110 is then supported by and connected to support rod 114 which in turn is supported by and connected to drive mechanism 116. For this embodiment, the functionality of the drive mechanism provides both a coarse and fine movement of the PRISM array in two dimensions over the surface of a sample. Coarse movement by an amount comparable to the size of the array as a whole enables the entire array to be positioned step-by-step over the sample surface. Fine movement by amounts which are a fraction of the spacing between PRISMs enables maximum spatial resolution for the measurement of the primary and secondary sources. Once again, it is preferred that the magnetometer 14 be selected so that the magnetic field can be measured over the entire sample surface without repositioning.

One method for producing either the one dimensional PRISM array shown in FIGS. 5A and 5B or the two dimensional PRISM array shown in FIGS. 6A and 6B is to apply stereo lithographic technology to "print" the pattern of PRISM material onto support structure 90 or support plate 110 to form the PRISMs. This method enables the very precise placement of PRISMs so that their position, inter-PRISM spacing, and PRISM dimensions and shapes are both highly controlled and well known. This information then enables a more accurate application of the measured magnetic field data to deduce details of the primary electric current of interest.

Figure 7A:
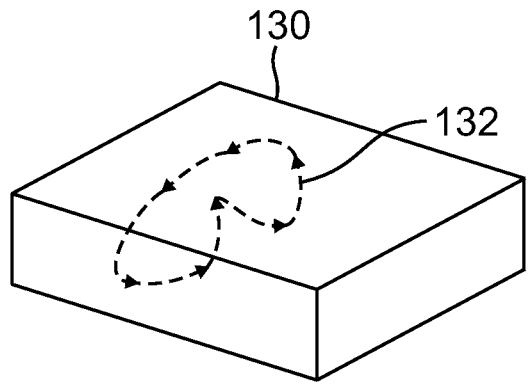
FIG. 7A is a diagram in accordance with an embodiment of the invention showing a non-biological conductive sample in which an electric current is flowing in the sample.
Figure 7B:
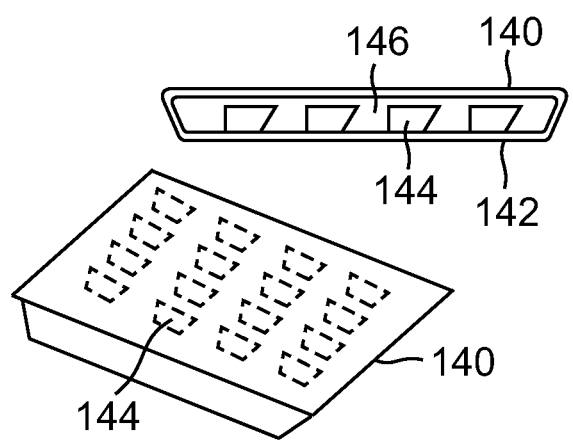
FIG. 7B is a diagram of a two-dimensional PRISM array installed in a modular container in accordance with an embodiment of the invention.
Figure 7C:
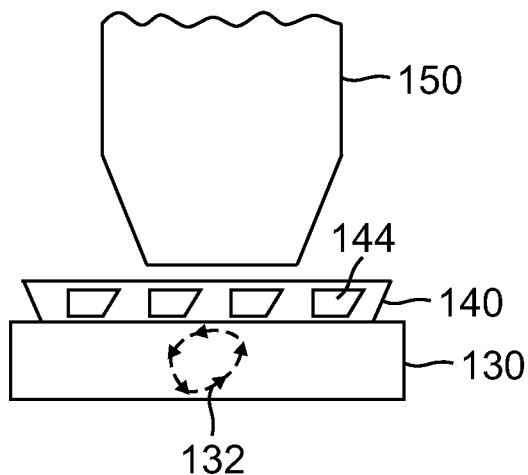
FIG. 7C is a diagram showing an embodiment of the invention which employs a two-dimensional PRISM array installed in a module which is scanned over the surface of a conductive sample.

A further embodiment is shown in FIG. 7C. This embodiment is intended for use with a non-biological sample 130, an example of which is shown in FIG. 7A, which is composed of a conductive material and within which a primary electric current of interest 132 flows. This embodiment employs a PRISM array module 140, shown in FIG. 7B, such as that disclosed in the U.S. patent application Ser. No. 13/206,392. The module contains an array of PRISMs 144 immersed in a conductive gel 146 and has a conductive surface 142 on which the PRISMs are mounted. For this embodiment, the module is placed on and in electrical contact with the sample in a region adjacent to the primary electric current of interest so that secondary sources are induced in the PRISMs within the array. Magnetometer 150 placed above the module detects and measures the magnetic field produced by the components of the primary electric current which are parallel to the surface of the sample as well as the magnetic fields produced by secondary sources induced in the PRISMs within the array by all components of the primary electric current source, including those perpendicular to the surface of the sample. The measured magnetic fields then provide information about the location, magnitude, and direction of all components of the primary electric current 132 within conductive sample 130. The scanning methods described in FIGS. 5 and 6 can be used for the non-biological samples with the PRISM making electrical contact with the sample as shown in FIG. 7C. In such an embodiment, a drive mechanism is connected to module 140 to move it incrementally to scan the sample. The same requirements for the drive mechanism as described above will pertain to this embodiment as well.

While particular embodiments of the present invention have been disclosed, it is to be understood that various different modifications and combinations are possible and are contemplated within the true spirit and scope of the disclosed embodiments. There is no intention, therefore, of limitations to the exact disclosures herein presented.

What is claimed is:

1. An apparatus for measuring the electric current flowing within a conductive sample, the apparatus comprising:
   a conductive medium selected from the group consisting of a conductive liquid and a conductive gelatinous solid;
   a container for immersing the conductive sample within the conductive medium;
   a primary source mirror;
   a support structure supporting the primary source mirror in a position proximate to a surface of the conductive sample immersed in the conductive medium;
   a first drive mechanism connected to the support structure, the drive mechanism being configured to move the support structure in a direction parallel to the surface of the conductive sample; and
   a means for measuring a magnetic field produced by electric currents and magnetic sources located within the conductive sample and the primary source mirror.

2. The apparatus of claim 1, wherein the means for measuring magnetic fields is a magnetometer utilizing a plurality of superconducting quantum interference devices.

3. The apparatus of claim 2, wherein the magnetometer measures the magnetic field at a plurality of locations over the conductive sample.

4. The apparatus of claim 1, wherein the conductive medium is a saline solution.

5. The apparatus of claim 1, wherein the first drive mechanism is configured to move the support structure in multiple directions.

6. The apparatus of claim 5, wherein the first drive mechanism is configured to move the support structure in incremental steps.

7. The apparatus of claim 1, and further comprising means for measuring the position of the primary source mirror relative to the conductive sample and relative to the means for measuring the magnetic field.

8. The apparatus of claim 7, and further comprising means for estimating the location, magnitude, and direction of the electric current flowing in the conductive sample utilizing the means for measuring the magnetic field.

9. The apparatus of claim 1, and further comprising means for adjusting the distance between the primary source mirror and the surface of the conductive sample.

10. The apparatus of claim 1, and further comprising:
    a support plate on which the container is mounted;
    a second drive mechanism connected to the support plate, the second drive mechanism being configured to move the support plate in a direction parallel to the direction of movement of the support structure.

11. The apparatus of claim 1, wherein the primary source mirror has a plurality of mirror surfaces.

12. An apparatus for measuring the electric current flowing within a conductive sample, the apparatus comprising:
    a conductive medium selected from the group consisting of a conductive liquid and a conductive gelatinous solid;
    a container for immersing the conductive sample within the conductive medium;
    an array of primary source mirrors;
    a support structure supporting the array in a position proximate to a surface of the conductive sample immersed in the conductive medium;
    a drive mechanism connected to the support structure, the drive mechanism being configured to move the support structure in a direction parallel to the surface of the conductive sample; and
    a means for measuring a magnetic field produced by electric currents and magnetic sources located within the conductive sample and the primary source mirror.

13. The apparatus of claim 12, wherein the array is a linear array.

14. The apparatus of claim 12, wherein the array is a two dimensional array.

15. The apparatus of claim 12, wherein the means for measuring the magnetic field measures the magnetic field at a plurality of locations over the conductive sample.

16. The apparatus of claim 12, wherein the drive mechanism being configured to move the support structure in multiple directions.

17. The apparatus of claim 16, wherein the drive mechanism being configured to move the support structure in incremental steps.

18. An apparatus for scanning a conductive sample having a flat surface to measure the location, magnitude, and direction of an electric current flowing within the conductive sample, the apparatus comprising:
- a two dimensional array of primary source mirrors, the array contained within a modular container filled with a conductive medium, the container having a conductive wall with an interior surface, the array mounted on the interior surface within the modular container;
- a drive mechanism connected to the modular container, the drive mechanism supporting the modular container in a position which places the conductive wall of the modular container in electrical contact with the flat surface of the conductive sample, the drive mechanism further having the capability to move the modular container in directions parallel to the surface of the conductive sample; and
- a means for measuring a magnetic field produced by the electric current flowing within the conductive sample and by secondary sources induced in the primary source mirrors.

19. A method for measuring the location, magnitude, and direction of electric currents flowing in a conductive sample, the method comprising:
- placing a conductive medium selected from the group consisting of a conductive liquid and a conductive gelatinous solid into a container;
- immersing the conductive sample in the conductive medium:
- positioning a primary source mirror supported by a support structure within the conductive medium and proximate to a surface of the conductive sample;
- connecting the support structure to a drive mechanism, the drive mechanism having the capability to move the support structure in a direction parallel to the surface of the conductive sample;
- placing a means for measuring a magnetic field above the electric currents and magnetic sources located within the conductive sample and the primary source mirror;
- measuring a magnetic field produced by electric currents and magnetic sources located within the conductive sample and the primary source mirror at a plurality of positions of the support structure, the position of the support structure being changed by the drive mechanism; and
- estimating the location, magnitude, and direction of the electric currents and magnetic sources based on the measured magnetic field at each position of the support structure.

20. A method for measuring the location, magnitude, and direction of electric currents flowing in a conductive sample, the method comprising:
- placing a conductive medium selected from the group consisting of a conductive liquid and a conductive gelatinous solid into a container;
- immersing the conductive sample in the conductive medium:
- positioning a primary source mirror array selected from the group comprising a linear primary source mirror array and a two-dimensional primary source mirror array, the primary source mirror array supported by a support structure within the conductive medium at a position proximate to a surface of the conductive sample;
- connecting the support structure to a drive mechanism, the drive mechanism having the capability to move the support structure in a direction parallel to the surface of the conductive sample;
- placing a means for measuring a magnetic field above the electric currents and magnetic sources located within the conductive sample and the primary source mirror array;
- measuring the magnetic field produced by electric currents and magnetic sources located within the conductive sample and the primary source mirror array at a plurality of positions of the support structure, the position of the support structure being changed by the drive mechanism; and
- estimating the location, magnitude, and direction of the electric currents and magnetic sources based on the measured magnetic field at each position of the support structure.

21. A method for scanning a conductive sample having a flat surface to measure the location, magnitude, and direction of an electric current flowing within the conductive sample, the method comprising:
- preparing a two dimensional array of primary source mirrors contained within a modular container filled with a conductive medium, the container having a conductive wall with an interior surface, the array mounted on the interior surface within the modular container;
- placing the conductive wall of the modular container into electrical contact with the flat surface;
- connecting a drive mechanism to the modular container, the drive mechanism having the capability to move the modular container in a direction parallel to the surface of the conductive sample;
- measuring a magnetic field produced by electric currents and magnetic sources located within the conductive sample and the primary source mirror array at a plurality of positions of the modular container, the position of the modular container being changed by the drive mechanism; and
- estimating the location, magnitude, and direction of the electric currents and magnetic sources based on the measured magnetic field at each position of the modular container.

* * * * *